United States Patent
Nagashima (10) Patent No.: US 8,910,792 B2
(45) Date of Patent: Dec. 16, 2014

(54) SUBSTRATE STORAGE CONTAINER

(75) Inventor: Tsuyoshi Nagashima, Tokyo (JP)

(73) Assignee: Miraial Co., Ltd., Tokyo (JP)

( * ) Notice: Subject to any disclaimer, the term of this patent is extended or adjusted under 35 U.S.C. 154(b) by 116 days.

(21) Appl. No.: 13/579,898

(22) PCT Filed: May 24, 2010

(86) PCT No.: PCT/JP2010/058705
§ 371 (c)(1),
(2), (4) Date: Aug. 17, 2012

(87) PCT Pub. No.: WO2011/148450
PCT Pub. Date: Dec. 1, 2011

(65) Prior Publication Data
US 2013/0056388 A1   Mar. 7, 2013

(51) Int. Cl.
*B65D 85/86* (2006.01)
*B65D 85/30* (2006.01)
*H01L 21/673* (2006.01)

(52) U.S. Cl.
CPC .... *H01L 21/67369* (2013.01); *H01L 21/67383* (2013.01)
USPC ............................ 206/711; 206/710; 206/454

(58) Field of Classification Search
USPC .......... 206/710–712, 454, 832–833, 722, 723
See application file for complete search history.

(56) References Cited

U.S. PATENT DOCUMENTS

| | | | |
|---|---|---|---|
| 6,206,197 B1 * | 3/2001 | Decamps et al. | 206/711 |
| 6,267,245 B1 * | 7/2001 | Bores et al. | 206/711 |
| 7,100,772 B2 * | 9/2006 | Burns et al. | 206/710 |
| 7,344,031 B2 * | 3/2008 | Hasegawa et al. | 206/710 |
| 7,823,730 B2 * | 11/2010 | Mimura et al. | 206/710 |
| 7,900,776 B2 * | 3/2011 | Burns et al. | 206/711 |

(Continued)

FOREIGN PATENT DOCUMENTS

| | | |
|---|---|---|
| JP | 2003-522078 | 7/2003 |
| JP | 2005-191021 | 7/2005 |
| WO | WO 00-02798 | 1/2000 |

OTHER PUBLICATIONS

The International Bureau, Notification of the Recording of a Change for PCT Application No. PCT/JP2010/058705, mail date Apr. 3, 2012.

(Continued)

*Primary Examiner* — Mickey Yu
*Assistant Examiner* — Chun Cheung
(74) *Attorney, Agent, or Firm* — SoCal IP Law Group LLP; Steven C. Sereboff; John E. Gunther (57) ABSTRACT

The position of a substrate temporal placement piece (4) is set so that the substrate temporal placement piece (4) does not overlap a disc-shaped substrate (W) from a viewing direction perpendicular to the surface of the disc-shaped substrate (W), when a lid (20) is attached to a substrate transfer opening (2) of a container main body (1) and the disc-shaped substrate (W) is pressed to a location where the substrate is positioned and held by a back side holding portion (3). Thereby, even if the disc-shaped substrate (W) stored in the container main body (1) is bent due to vibration, impact, etc., there is no danger that the substrate (W) is in contact with the substrate temporal placement piece (4), and the disc-shaped substrate (W) having a larger diameter can be safely stored.

9 Claims, 8 Drawing Sheets

(56) References Cited

U.S. PATENT DOCUMENTS

| | | | |
|---|---|---|---|
| 7,922,000 B2* | 4/2011 | Hyobu | 206/454 |
| 8,318,275 B2* | 11/2012 | Kudo et al. | 206/454 |
| 8,464,872 B2* | 6/2013 | Inoue | 206/711 |
| 2005/0247594 A1* | 11/2005 | Mimura et al. | 206/710 |
| 2005/0274625 A1* | 12/2005 | Joslin | 205/640 |
| 2006/0283774 A1* | 12/2006 | Hasegawa et al. | 206/725 |
| 2007/0295638 A1* | 12/2007 | Nakatogawa | 206/711 |

OTHER PUBLICATIONS

Japan Patent Office, International Search Report for PCT Application No. PCT/JP2010/058705, mail date Jun. 15, 2010.

* cited by examiner

[III]

[VII]

FIG. 8

[VIII]

[XIII]

FIG. 14

[XIV]

SUBSTRATE STORAGE CONTAINER

RELATED APPLICATIONS

This application is filed under 35 USC 371 as a National Stage of International Application PCT/JP2010/058705, which is incorporated herein by reference.

TECHNICAL FIELD

The present invention relates to a substrate storage container for storing a plurality of thin disc-shaped substrates such as semiconductor wafers, circular quartz glass substrates, and the like for the purpose of storage, transportation, and the like.

BACKGROUND ART

A substrate storage container generally has a container main body for storing a plurality of disc-shaped shape substrates such as semiconductor wafer in a parallel manner therein. A substrate transfer opening for transferring the disc-shaped substrate is formed in the container main body. Then, a lid body for sealing the substrate transfer opening is provided so as to be mounted in a detachable manner from outside to the substrate transfer opening.

In order to hold the disc-shaped substrate inside the container main body in a state without rattling, a back side holding portion is disposed at a back side area inside of the container main body as seen from the substrate transfer opening, and a lid side retainer is provided at an inner wall portion of a lid body.

However, the lid side retainer does not enter a state of holding the disc-shaped substrate until the lid body is mounted to the substrate transfer opening of the container main body. For this reason, a substrate temporal placement piece is provided for placing the disc-shaped substrate at an area proximal to the substrate transfer opening, during a state in which the lid body is not mounted. When the disc-shaped substrate enters a state held by the lid side retainer, the disc-shaped substrate is brought into a state floating from the substrate temporal placement piece (for example, refer to Japanese Unexamined Patent Application (Translation of PCT Publication), Publication No. 2003-522078; FIG. 10, etc.).

DISCLOSURE OF THE INVENTION

Problems to be Solved by the Invention

Recently, advancements have been made in increasing the diameter of semiconductor wafers and the like with the purpose of productivity improvement, cost reduction, and the like. In the case of semiconductor wafers, 300 mm is currently predominant for the diameter; however, it is expected that the diameter will reach 450 mm in the near future.

When vibration, impact and the like acts on the substrate storage container, bending occurs in the disc-shaped substrates stored inside thereof. The amount of such bending on the disc-shaped substrates becomes significantly greater as the diameter of the disc-shaped substrate increases. This is because the thickness of the disc-shaped substrate does not increase in correspondence with the diameter.

Therefore, when the disc-shaped substrate bends by vibration or impact acting on the substrate storage container, the disc-shaped substrate being held in a state floating from the substrate temporal placement piece inside of the substrate storage container, may contact (or hit) the substrate temporal placement piece and be damaged or contaminated in the substrate storage container.

It is an object of the present invention to provide a substrate storage container in which, even if a disc-shaped substrate stored in the substrate storage container is bent due to vibration, impact, etc., there is no risk of the substrate contacting a substrate temporal placement piece, and even disc-shaped substrates of increased diameter can be safely stored.

Means for Solving the Problems

In order to achieve the abovementioned object, a substrate storage container is provided which includes a container main body for storing a plurality of disc-shaped substrates in a parallel manner; a substrate transfer opening that is formed in the container main body for transferring the disc-shaped substrate relative to the container main body; a lid body that is attached in a detachable manner from outside to the substrate transfer opening in order to seal the substrate transfer opening; a back side holding portion that positions and holds an outer edge portion of each of the disc-shaped substrates in a back side area inside of the container main body as seen from the substrate transfer opening; a lid side retainer that is provided at an inner wall portion of the lid body and that positions and holds each of the disc-shaped substrates by pushing to a side of the back side holding portion; and a substrate temporal placement piece for placing the disc-shaped substrate at an area proximal to the substrate transfer opening when the lid body is not attached to the substrate transfer opening, in which the substrate storage container further includes: a substrate placement portion for placing a vicinity of the outer edge portion of the disc-shaped substrate in a back side area inside of the container main body as seen from the substrate transfer opening, when the disc-shaped substrate is not being pushed by the lid side retainer; and a substrate return means for returning the disc-shaped substrate to a position not held or positioned by the back side holding portion, when the disc-shaped substrate that is being pushed by the lid side retainer enters a state not being pushed by way of the lid side retainer; and in which a position of the substrate temporal placement piece is established such that: the substrate temporal placement piece overlaps with the disc-shaped substrate as seen in a vertical direction with respect to a face of the disc-shaped substrate, when the lid body is removed from the substrate transfer opening and the disc-shaped substrate is not held or positioned by the back side holding portion; and the substrate temporal placement piece does not overlap with the disc-shaped substrate as seen in a vertical direction with respect to a face of the disc-shaped substrate, when the lid body is attached to the substrate transfer opening and the disc-shaped substrate is pushed to a position being positioned and held by the back side holding portion.

Furthermore, the substrate return means may be a spring-like member that contacts a circumferential face of the disc-shaped substrate. The substrate placement portion may be integrally formed with the spring-like member to be adjacent to a contact face of the spring-like member abutting the disc-shaped substrate. The spring-like member may be provided so as to extend from an end portion of the back side holding portion.

The back side holding portion and the substrate placement portion may be provided integrally to be adjacent to each other. A hole may be formed between the back side holding portion and the substrate placement portion, and a tip end portion of the spring-like member may abut a circumferential face of the disc-shaped substrate through the hole.

The substrate return means may be a sloped face that guides the disc-shaped substrate obliquely downward with the force of gravity. The back side holding portion and the substrate placement portion may be formed integrally and continuously interposing the sloped face. The sloped face may be either face among two faces that form a V-shaped groove at the back side holding portion.

Effects of the Invention

According to the present invention, a position of the substrate temporal placement piece is established such that the substrate temporal placement piece does not overlap with the disc-shaped substrate as seen in a vertical direction with respect to a face of the disc-shaped substrate, when the lid body is attached to the substrate transfer opening and the disc-shaped substrate is pushed to a position being positioned and held by the back side holding portion. Therefore, it is not likely that the disc-shaped substrate stored in the container main body is in contact with the substrate temporal placement piece due to vibration, impact, etc., even if the disc-shaped substrate is set to have a larger diameter thereof. Therefore, a disc-shaped substrate such as a semiconductor wafer, a quartz glass substrate, and the like can be safely stored.

EXPLANATION OF REFERENCE NUMERALS

1 container main body
2 substrate transfer opening
3 back side holding portion
4 substrate temporal placement piece
6 substrate placement portion
7 spring-like member (substrate return means)
8 contact face
9 hole
10 sloped face (substrate return means)
20 lid body
21 lid side retainer
W disc-shaped substrate

PREFERRED MODE FOR CARRYING OUT THE INVENTION

In the following, embodiments of the present invention are explained with reference to the drawings.

Figure 1:
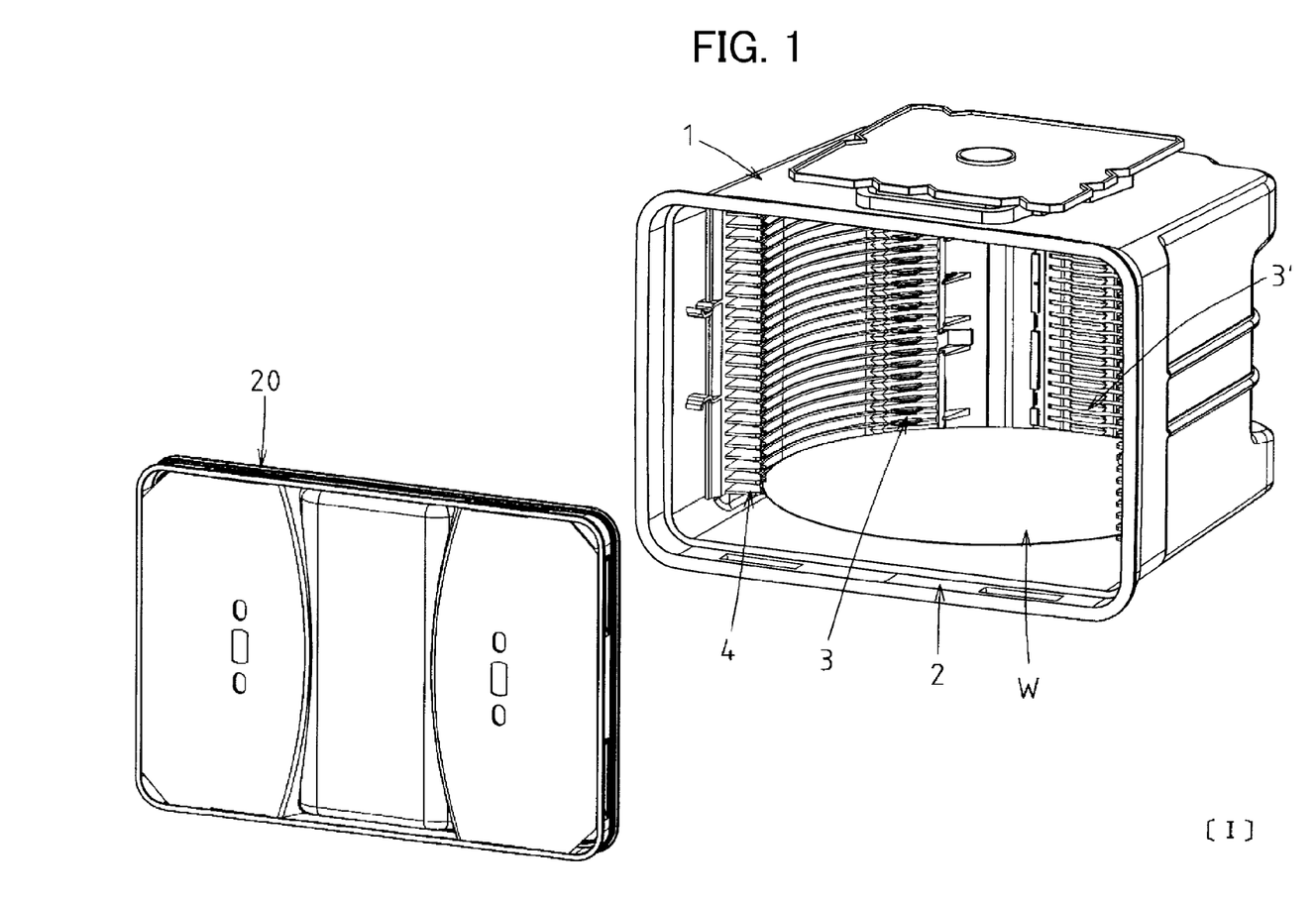
FIG. 1 is a perspective view of an outer appearance of a substrate storage container according to a first embodiment of the present invention in a state with a lid body removed.
Figure 2:
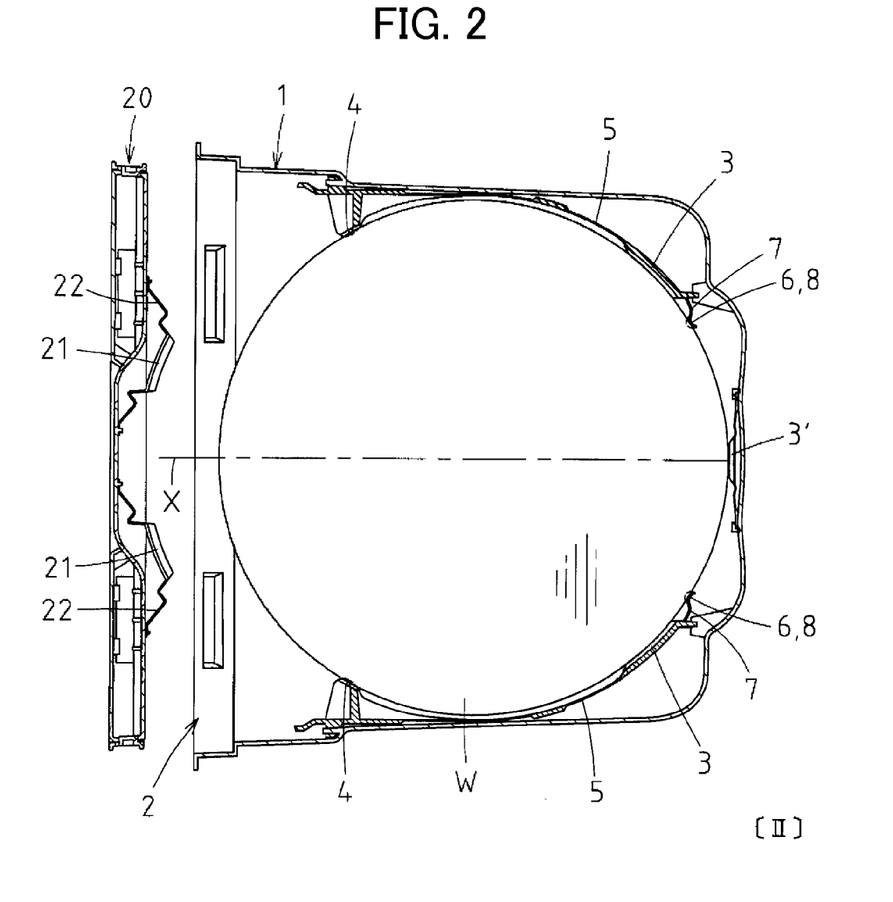
FIG. 2 is a plane cross-sectional view of the substrate storage container according to the first embodiment of the present invention in a state with the lid body removed.

FIG. 1 is a perspective view of a substrate storage container according to a first embodiment of the present invention. FIG. 2 is a plane cross-sectional view thereof. The reference numeral 1 is a container main body for storing, in a parallel manner, a plurality of disc-shaped substrates W formed in a thin disc shape. The container main body 1 is arranged so that each disc-shaped substrate W is stored oriented in a horizontal direction, while the disc-shaped substrate W is transferred.

The plurality of disc-shaped substrates W is stored so as to be spaced apart from each other in a direction that a face of the substrate faces to each other. However, a state of only a single disc-shaped substrate W being stored at the lowest position in the container main body is illustrated in FIG. 1. In addition, although the disc-shaped substrate W is a semiconductor wafer in this embodiment, it is not limited thereto, and may be a circular quartz glass substrate or the like.

A substrate transfer opening 2 for transferring the disc-shaped substrates W is formed at one side face among the side four faces of the container main body 1. Then, a lid body 20 for sealing the substrate transferring opening 2 is provided so as to be attached detachably from the outside to the substrate transfer opening 2.

In addition, a sealing member having elasticity for sealing between the substrate transfer opening 2 and an outer edge portion of the lid body 20, a lock mechanism for locking the lid body 20, and the like are provided to the lid body 20. The explanations for these are omitted.

In a back side area in the container main body 1 as seen from the substrate transfer opening 2, back side holding portions 3 are arranged for holding and positioning an outer edge portion of each disc-shaped substrate W in the container main body 1. As shown in FIG. 2, the back side holding portions 3 are arranged in pairs, which are provided to be spaced apart on the right side and left side from the center line X (the center line of the container main body 1 in a vertical direction with respect to the substrate transfer opening 2), as seen from the substrate transfer opening 2. The back side holding portions 3 will be described later in detail.

The reference numeral 3' is a rear retainer, which is disposed proximal to the backmost position on the center line X in the container main body 1. The rear retainer 3' has a function of holding the disc-shaped substrate W by elastically biasing toward the side of the substrate transfer opening 2.

However, the rear retainer 3' may be or may not be arranged in the present invention. The rear retainer 3' will not be explained below.

On the other hand, known lid side retainers 21 for holding and positioning an outer edge portion of each disc-shaped substrate W by elastically pressing each from the substrate transfer opening 2 toward the back side holding portion 3 are provided at an inner wall portion of the lid body 20.

The lid side retainer 21 includes a V-shaped groove portion that abuts a peripheral portion of each disc-shaped substrate W when the lid body 20 is attached to the substrate transfer opening 2 of the container main body 1. This V-shaped groove portion is supported by a support member 22 which possesses spring characteristics and thus elastically deforms easily. The lid side retainer 21 is provided proximal to the position of the center line X.

At positions that are at proximal regions to the substrate transfer opening 2 in the container main body 1 and separated from the center line X (i.e. proximal positions to right and left walls of the container main body 1), substrate temporal placement pieces 4 are provided. The substrate temporal placement pieces 4 places an outer edge portion of the disc-shaped substrate W when the lid body 20 is in a state of not being attached to the substrate transfer opening 2.

Figure 3:
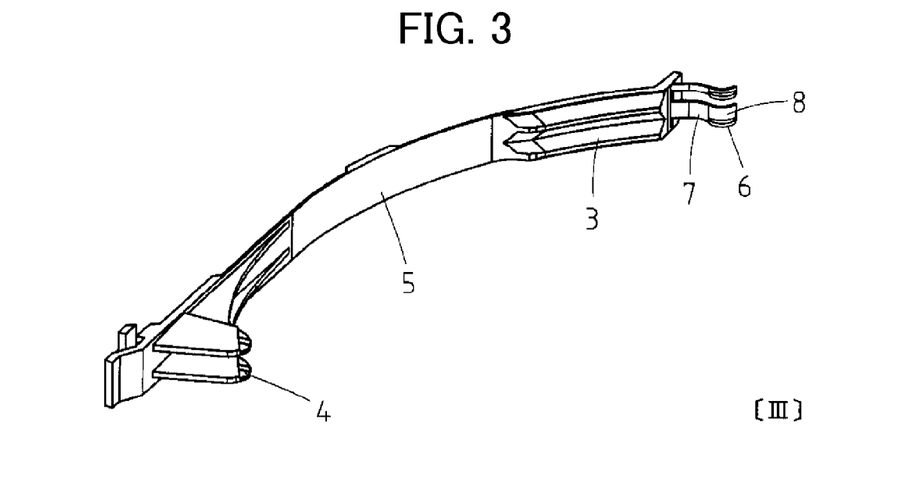
FIG. 3 is a perspective view illustrating a single member supporting a substrate in the substrate storage container according to the first embodiment of the present invention.

As shown in FIG. 3, the back side holding portion 3 and the substrate temporal placement piece 4 are integrally formed as a single plastic part with a connecting portion 5 interposing them. The back side holding portion 3 is established as a V shaped groove with a side far from the center of the disc-shaped substrate W as a bottom.

Therefore, when each of the disc-shaped substrate W pushed from the substrate transfer opening 2 toward the back side holding portion 3 by way of the lid side retainer 21, a portion of a circumferential ridge line on the disc-shaped substrate W enters a state pressed into the V shaped groove portion of the back side holding portion 3. Each of the disc-shaped substrate W thereby enters a state held and positioned there (refer to FIG. 5).

It should be noted that a member for supporting only a left half (i.e. a left half as seen from a side of the substrate transfer opening 2) of a single disc-shaped substrate W in the container main body 1 is illustrated in FIG. 3. However, in the container main body 1, similar members are arranged in a vertically stacked state as well as symmetrically in a plurality of pairs.

The substrate temporal placement piece 4 is a shelf-shaped member that protrudes inwards from a side wall of the container main body 1. When the lid body 20 is in a state not attached to the substrate transfer opening 2 (in a state in which the disc-shaped substrate W is not pushed to the back side by the lid side retainer 21), an outer edge portion of the disc-shaped substrate W enters a state placed proximal to a tip of the substrate temporal placement piece 4.

A substrate placement portion 6 is a portion for placing a vicinity of the outer edge portion of the disc-shaped substrate W in a back side area in the container main body 1 as seen from the substrate transfer opening 2, when the disc-shaped substrate W is in a state not pushed by the lid side retainer 21. The cross-sectional shape of the substrate placement portion 6 is formed in a small L shape. The disc-shaped substrate W is placed at a horizontal face portion of the substrate placement portion 6.

Such a substrate placement portion 6 is formed at a tip end portion of a spring-like member 7 that extends further in a circumferential direction of the disc-shaped substrate W from an end part of the back side holding portion 3. The spring-like member 7 is formed by integral molding with the back side holding portion 3, the substrate temporal placement piece 4, and the connecting portion 5, and possesses a spring characteristic. Then, a vertical face that rises vertically from the substrate placement portion 6 at the tip end of the spring-like member 7 forms a contact face 8 that abuts a circumferential face of the disc-shaped substrate W.

In a state in which the lid body 20 is not attached to the substrate transfer opening 2, the disc-shaped substrate W that is placed on the substrate temporal placement piece 4 and the substrate placement portion 6 is pushed by the lid side retainer 21 from a side of the substrate transfer opening 2 by the lid body 20 being attached. Then, the outer edge portion of the disc-shaped substrate W moves to the back side in a state of being placed on the substrate placement portion 6, while the spring-like member 7 being elastically deformed, to be fitted in the V-shaped groove portion of the back side holding portion 3 and enter a state of being held and positioned.

Furthermore, the disc-shaped substrate W that is pushed from the side of the substrate transfer opening 2 by the lid side retainer 21 enters a state in which the disc-shaped substrate W is not pushed by the lid side retainer 21 due to the lid body 20 being removed. Then, due to the spring-like member 7 returning to the shape prior to the elastic deformation, the disc-shaped substrate W is pushed back to the substrate transfer opening 2, and the disc-shaped substrate W is returned to a position not held and positioned by the back side holding portion 3.

Figure 4:
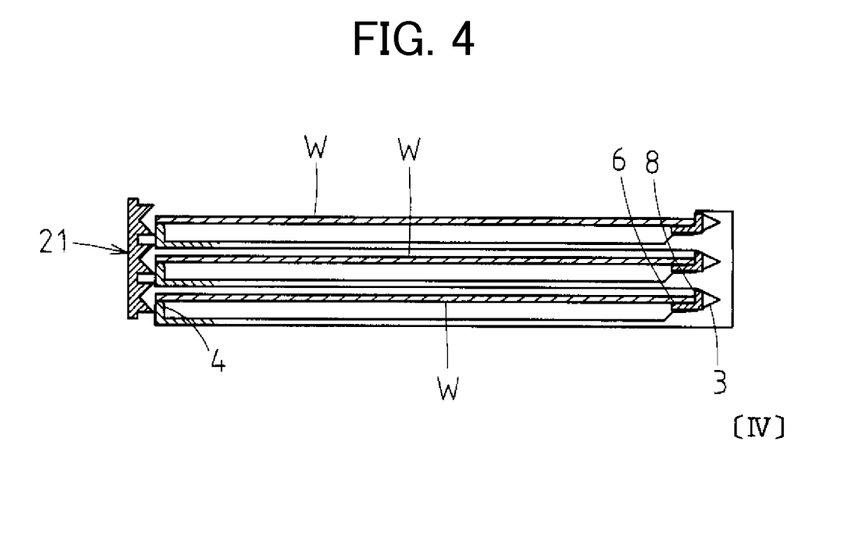
FIG. 4 is a combined lateral cross-sectional view of the substrate storage container according to the first embodiment of the present invention in a state with the lid body being not attached.

FIG. 4 is a schematic view of a lateral cross section of the container main body 1 in a state in which the lid body 20 is not attached to the substrate transfer opening 2. FIG. 4 combines the cross-sectional shapes of a plurality of preferable portions appropriate for explanation so as to be illustrated as a single figure.

In this way, when in a state in which the lid body 20 is removed from the substrate transfer opening 2 and the outer edge portion of the disc-shaped substrate W is placed on the substrate placement portion 6, the substrate temporal placement piece 4 and the disc-shaped substrate W overlap each other as seen in a vertical direction with respect to a face of the disc-shaped substrate W, as illustrated in FIG. 2.

As a result thereof, as illustrated in FIG. 4, the outer edge portion of each of the disc-shaped substrates W enters a state placed on the substrate temporal placement piece 4 on a side of the substrate transfer opening 2, and enters a state placed on the substrate placement portion 6 thereof without being fitted in the V-shaped groove of the back side holding portion 3 on the back side.

Figure 5:
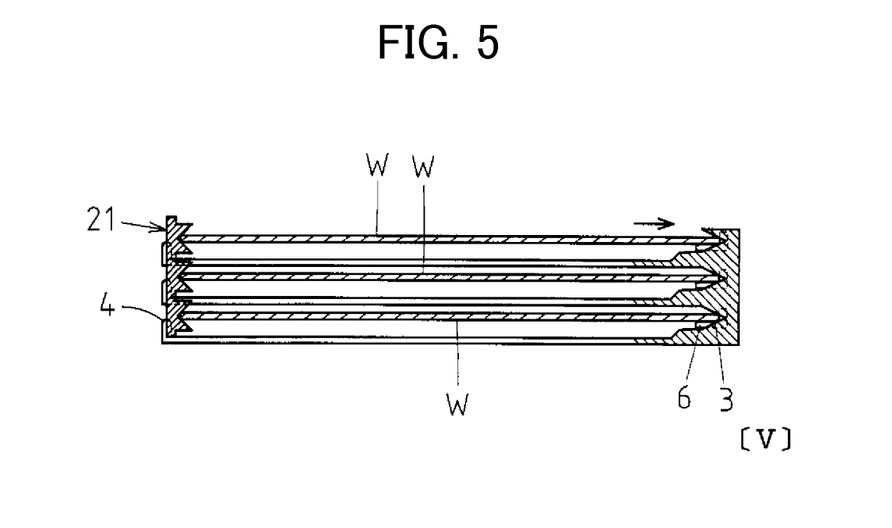
FIG. 5 is a combined lateral cross-sectional view of the substrate storage container according to the firs embodiment of the present invention with the lid body being attached.
Figure 6:
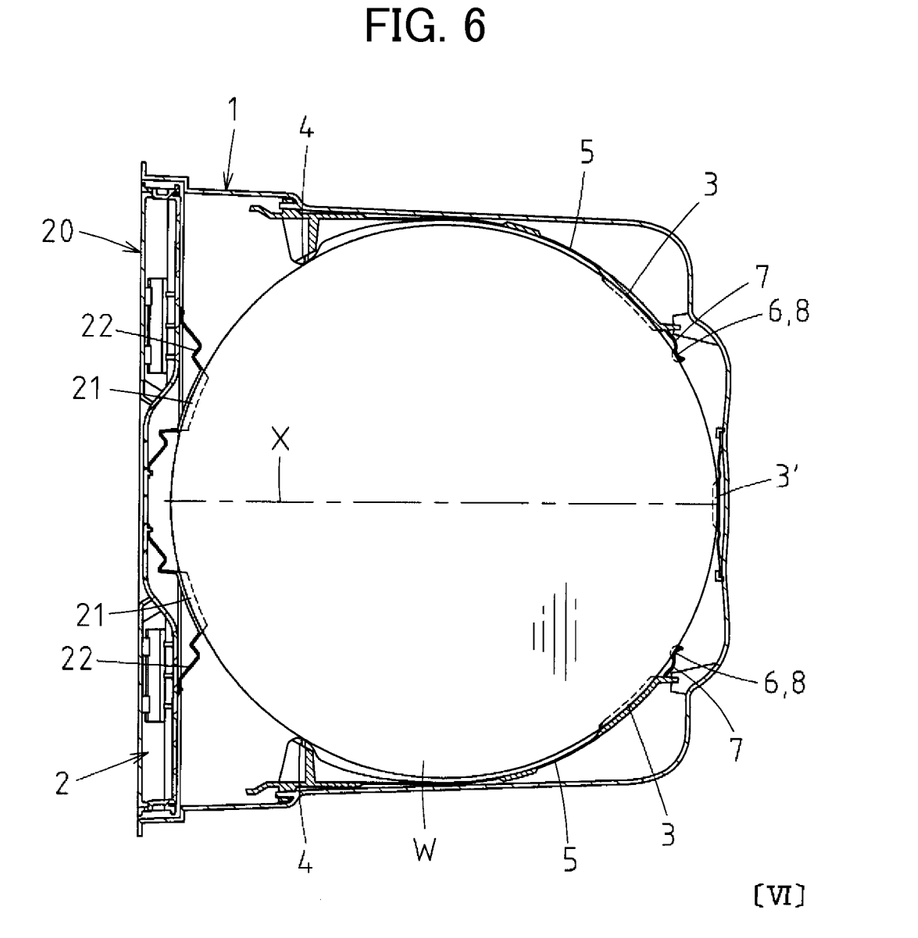
FIG. 6 is a plane cross-sectional view of the substrate storage container according to the first embodiment of the present invention in a state with the lid body attached.

When the lid body 20 is attached to the substrate transfer opening 2, as schematically illustrated in FIG. 5, the disc-shaped substrate W is pushed up to a position entering a state fitted to each V-shape groove of the lid side retainer 21 and the back side holding portion 3 to be held and positioned. Then, as illustrated in FIG. 6, the substrate temporal placement piece 4 and the disc-shaped substrate W no longer overlap as seen in a vertical direction with respect to a face of the disc-shaped substrate W. The position of the substrate temporal placement piece 4 is set in this way in the container main body 1.

Therefore, in a state in which the lid body 20 is attached to the substrate transfer opening 2, even if the disc-shaped substrate W stored in the container main body 1 is bent due to vibration, impact, etc., it is not likely that the substrate W is in contact with the substrate temporal placement piece 4, and the disc-shaped substrate W having a larger diameter can be safely stored.

Then, when the lid body 20 is removed from the substrate transfer opening 2, the disc-shape substrate W is slightly moved back to the side of the substrate transfer opening 2 by the spring-like member 7 and enters a state overlapped with the substrate temporal placement piece 4. Then, as illustrated in FIG. 2, the disc-shape substrate W enters a state placed on the substrate temporal placement piece 4 and the substrate placement portion 6.

Figure 7:
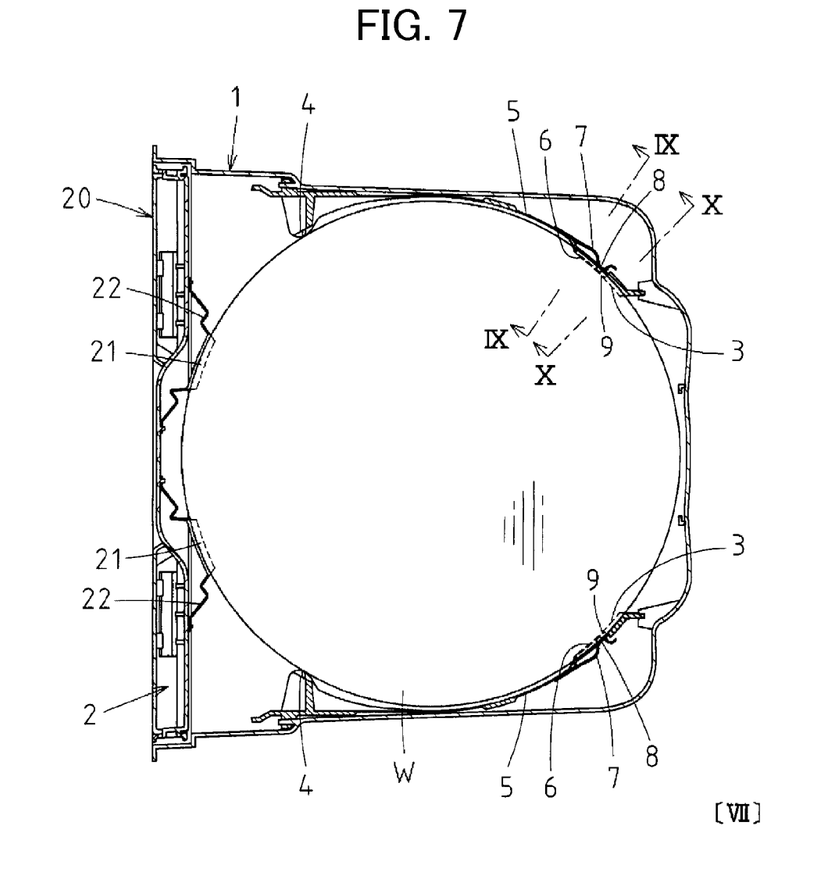
FIG. 7 is a plane cross-sectional view of a substrate storage container according to a second embodiment of the present invention in a state with a lid body being attached.
Figure 8:
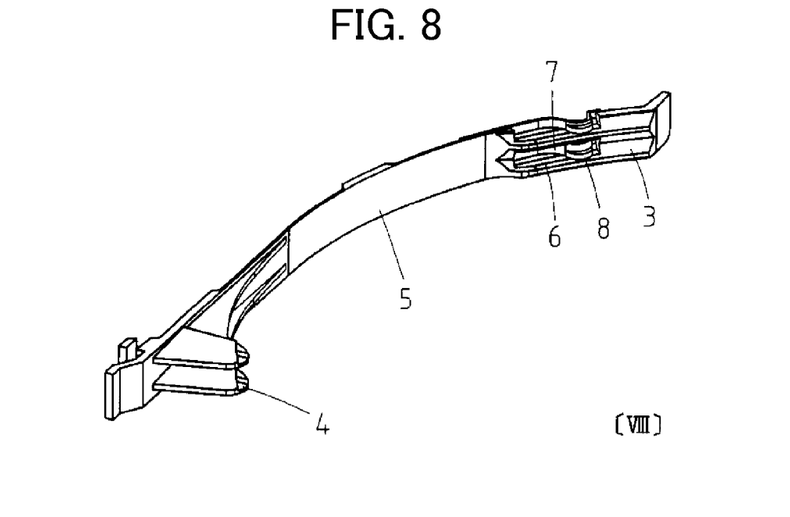
FIG. 8 is a perspective view illustrating a single member supporting a substrate of the substrate storage container according to the second embodiment of the present invention.

FIG. 7 is a plane cross-sectional view of a substrate storage container according to a second embodiment of the present invention in a state with a lid body 20 attached. In this embodiment, a back side holding portion 3 and a substrate placement portion 6 are adjacent to each other and are provided integrally by monolithic molding with the substrate temporal placement piece 4. FIG. 8 is a perspective view illustrating this member.

Furthermore, in the present embodiment, a spring-like member 7 is formed as an independent component. A base portion of the spring-like member 7 is fixed to a back face portion of a connecting portion 5. Then, a hole 9 is formed between the back side holding portion 3 and the substrate placement portion 6. A tip end portion of the spring-like member 7 is made so as to abut a circumferential face of the disc-shaped substrate W through the hole 9. A rear retainer is not provided (it should be noted that the rear retainer may be provided).

Figure 9:
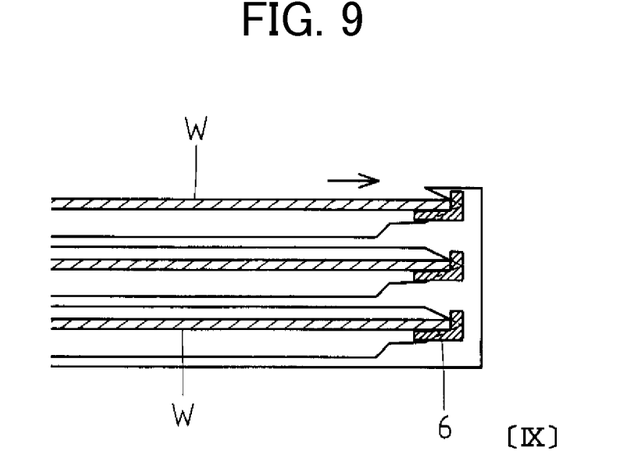
FIG. 9 is a cross-sectional view illustrating a cross section along IX-IX in FIG. 7.
Figure 10:
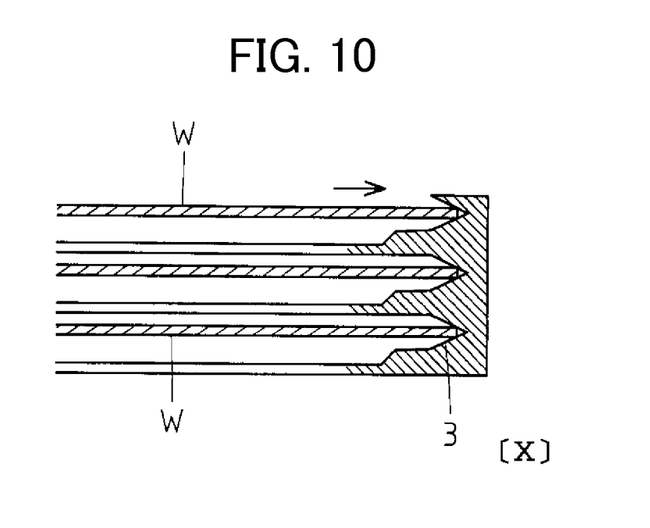
FIG. 10 is a cross-sectional view illustrating a cross section along X-X in FIG. 7.

FIGS. 9 and 10 illustrate a cross section along IX-IX and a cross section along X-X in FIG. 7, respectively. Similarly to the first embodiment, the substrate placement portion 6 includes a flat face that coincides with a lower face of the disc-shaped substrate W for placing the disc-shaped substrate W. The back side holding portion 3 includes a V-shaped groove in order to position and fix the disc-shaped substrate W.

The other configurations are similar to those of the first embodiment. As illustrated in FIG. 7, in a state in which a lid body 20 is attached to a substrate transfer opening 2 of a container main body 1, the disc-shaped substrate W is pushed to a back side, and the substrate temporal placement piece 4 and the disc-shaped substrate W enter a not overlapping state as seen in a vertical direction with respect to a face of the disc-shaped substrate W.

Then, when the lid body 20 is removed from the substrate transfer opening 2, the disc-shaped substrate W is slightly moved back to a side of the substrate transfer opening 2 by the spring-like member 7 and enters a state overlapped with the substrate temporal placement piece 4. Then, similarly to the first embodiment illustrated in FIG. 2, the disc-shaped substrate W enters a state placed on the substrate temporal placement piece 4 and the substrate placement portion 6.

Figure 11:
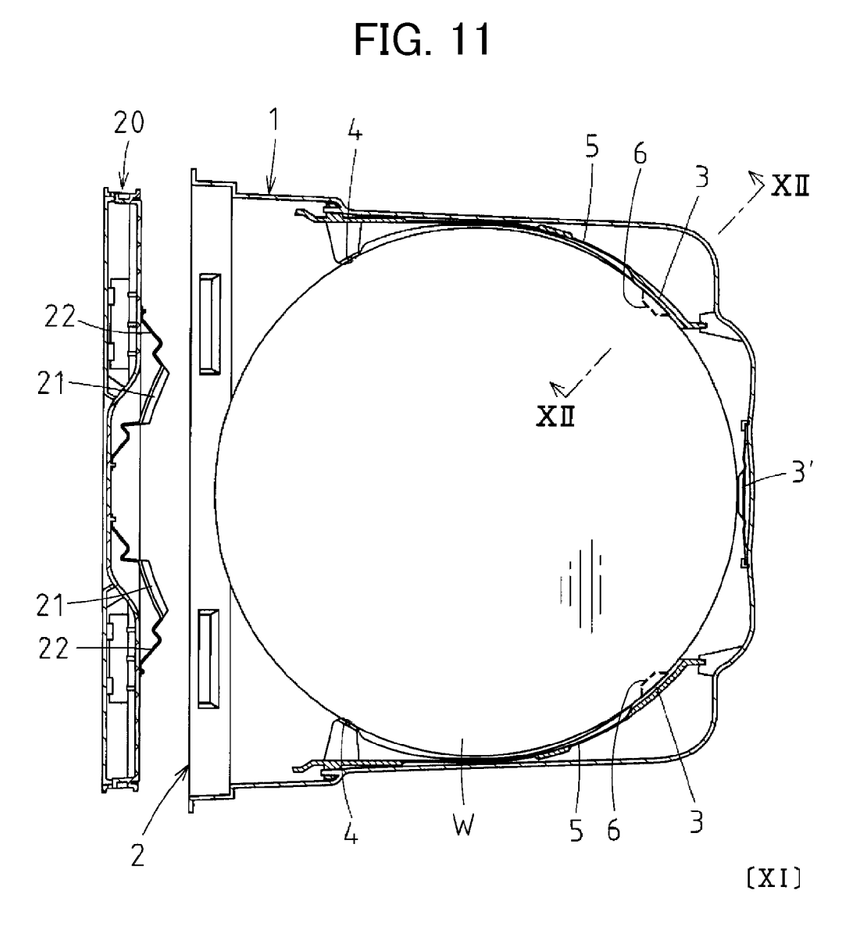
FIG. 11 is a plane cross-sectional view of a substrate storage container according to a third embodiment of the present invention in a state with a lid body removed.
Figure 13:
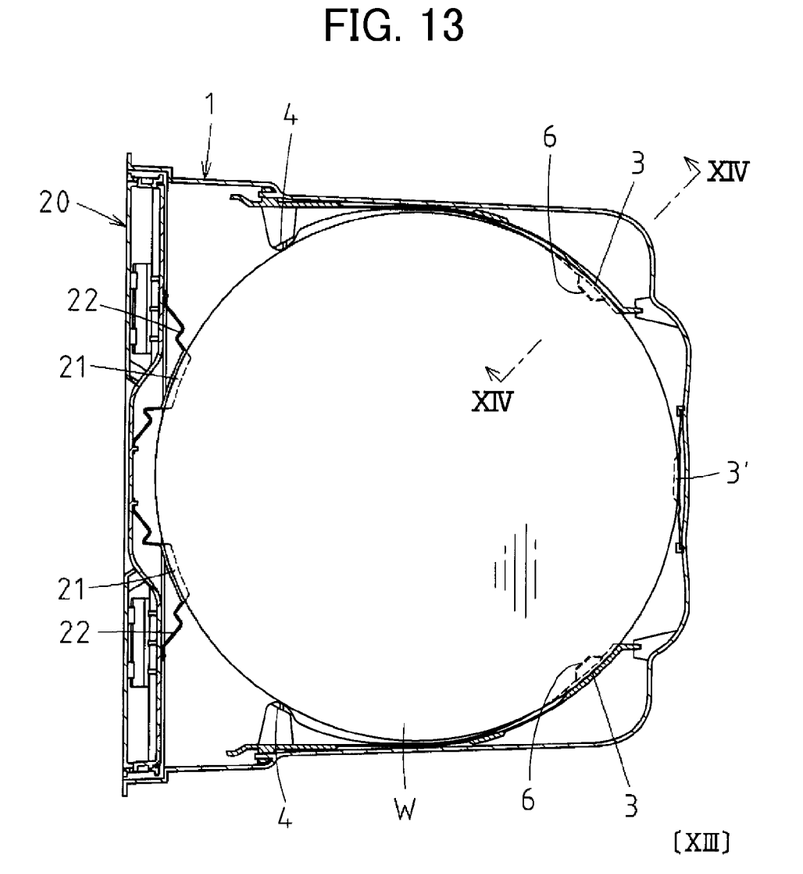
FIG. 13 is a plane cross-sectional view of the substrate storage container according to the third embodiment of the present invention in a state with the lid body being attached.

FIGS. 11 and 13 are plane cross-sectional views of a substrate storage container according to a third embodiment of the present invention, in a state with a lid body 20 not being attached, and in a state with the lid body 20 being attached, respectively. In this embodiment, the back side holding portion 3 in a V-shaped groove shape and the substrate placement portion 6 in a horizontal face shape are integrally formed to be continuous.

Figure 12:
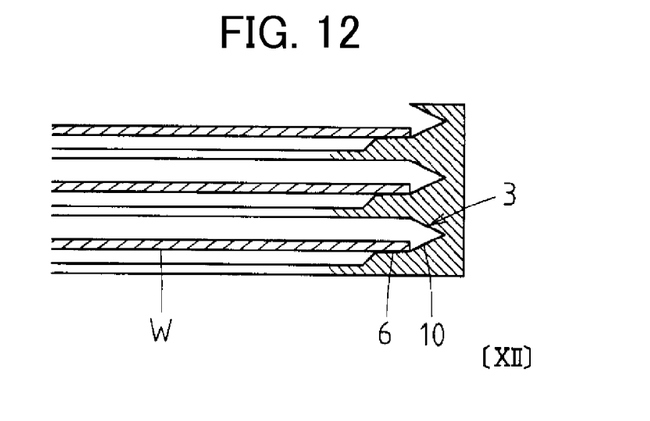
FIG. 12 is a cross-sectional view illustrating a cross section along XII-XII in FIG. 11.
Figure 14:
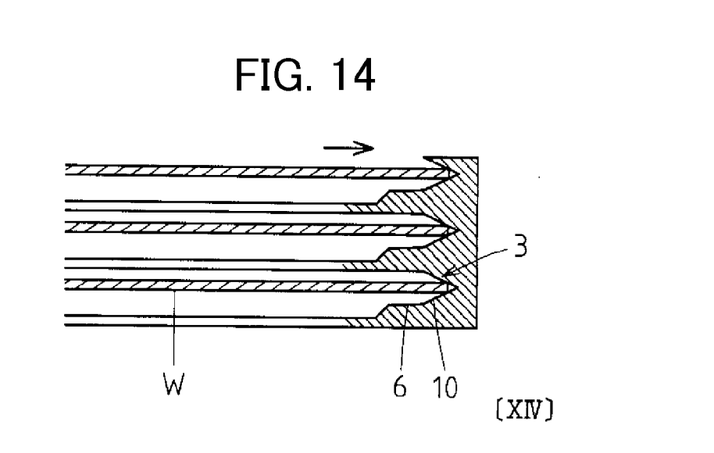
FIG. 14 is a cross-sectional view illustrating a cross section along XIV-XIV in FIG. 13.

A type of spring is not provided as a substrate return means. As illustrated in FIGS. 12 and 14 showing an XII-XII cross section and an XIV-XIV cross section, respectively, a lower sloped face 10 among the two sloped faces that form a V-shaped groove at the back side holding portion 3 is a substrate return means that guides a disc-shaped substrate W to a downward sloped substrate placement portion 6 with the force of gravity. Therefore, it can also be recognized that the back side holding portion 3 and the substrate placement portion 6 are formed integrally and continuously interposing the sloped face 10, which is the substrate return means.

In the embodiment configured in this way, when the lid body 20 is not attached to the substrate transfer opening 2 of the container main body 1, as shown in FIGS. 11 and 12, an outer edge portion of each of the disc-shaped substrates W enters a state placed on the substrate temporal placement piece 4 on a side of the substrate transfer opening 2, and enters a state placed on the substrate placement portion 6 on the back side without being fitted in the V-shaped groove of the back side holding portion 3 on the back side.

Then, when the lid body 20 is attached to the substrate transfer opening 2, as illustrated in FIGS. 13 and 14, the disc-shaped substrate W is pushed by a lid side retainer 21 to a position where it is fitted in a V-shaped groove of the back side holding portion 3 to be held and positioned. Then, the substrate temporal placement piece 4 and the disc-shaped substrate W are not overlapped as seen in a vertical direction with respect to a face of the disc-shaped substrate W.

As a result, even if the disc-shaped substrate W stored in the container main body 1 is bent due to vibration, impact, etc., there is no risk of the substrate W contacting the substrate temporal placement piece 4, and the disc-shaped substrate W having a larger diameter can be safely stored.

Then, when the lid body 20 is removed from the substrate transfer opening 2, the disc-shaped substrate W slides down on the sloped face 10 with the force of gravity to move back to a state placed on the substrate placement portion 6 as shown in FIG. 12. Then, the disc-shaped substrate W enters a state overlapping with the substrate temporal placement piece 4 as well as entering a state placed on the substrate temporal placement piece 4 and the substrate placement portion 6.

The invention claimed is:

1. A substrate storage container comprising:
a container main body for storing a plurality of disc-shaped substrates in a parallel manner;
a substrate transfer opening that is formed in the container main body for transferring the disc-shaped substrate relative to the container main body;
a lid body that is attached in a detachable manner from outside to the substrate transfer opening in order to seal the substrate transfer opening;
a back side holding portion that positions and holds an outer edge portion of each of the disc-shaped substrates in a back side area inside of the container main body as seen from the substrate transfer opening;
a lid side retainer that is provided at an inner wall portion of the lid body and that positions and holds each of the disc-shaped substrates by pushing to a side of the back side holding portion; and
a substrate temporal placement piece for placing the disc-shaped substrate at an area proximal to the substrate transfer opening when the lid body is not attached to the substrate transfer opening,
wherein the substrate storage container further comprises:
a substrate placement portion for placing a vicinity of the outer edge portion of the disc-shaped substrate in a back side area inside of the container main body as seen from the substrate transfer opening, when the disc-shaped substrate is not being pushed by the lid side retainer; and
a substrate return means for returning the disc-shaped substrate to a position not held or positioned by the back side holding portion, when the disc-shaped substrate that is being pushed by the lid side retainer enters a state not being pushed by way of the lid side retainer; and
wherein a position of the substrate temporal placement piece is established such that:
the substrate temporal placement piece overlaps with the disc-shaped substrate as seen in a vertical direction with respect to a face of the disc-shaped substrate, when the lid body is removed from the substrate transfer opening and the disc-shaped substrate is not held or positioned by the back side holding portion; and the substrate temporal placement piece does not overlap with the disc-shaped substrate as seen in a vertical direction with respect to a face of the disc-shaped substrate, when the lid body is attached to the substrate transfer opening and the disc-shaped substrate is pushed to a position being positioned and held by the back side holding portion.

2. The substrate storage container according to claim 1, wherein the substrate return means is a spring-like member that contacts a circumferential face of the disc-shaped substrate.

3. The substrate storage container according to claim 2, wherein the substrate placement portion is integrally formed with the spring-like member to be adjacent to a contact face of the spring-like member abutting the disc-shaped substrate.

4. The substrate storage container according to claim 2, wherein the spring-like member is provided so as to extend from an end portion of the back side holding portion.

5. The substrate storage container according to claim 2, wherein the back side holding portion and the substrate placement portion are provided integrally to be adjacent to each other.

6. The substrate storage container according to claim 5, wherein
a hole is formed between the back side holding portion and the substrate placement portion, and a tip end portion of the spring-like member abuts a circumferential face of the disc-shaped substrate through the hole.

7. The substrate storage container according to claim 1, wherein the substrate return means is a sloped face that guides the disc-shaped substrate obliquely downward with the force of gravity.

8. The substrate storage container according to claim 7, wherein the back side holding portion and the substrate placement portion are formed integrally and continuously interposing the sloped face.

9. The substrate storage container according to claim 7, wherein the sloped face is either face among two faces that form a V-shaped groove at the back side holding portion.

* * * * *